United States Patent [19]
Morita et al.

[11] Patent Number: 6,156,870
[45] Date of Patent: Dec. 5, 2000

[54] RESIN COMPOSITION WHICH CAN BE CURED BY APPLICATION OF HEAT OR IRRADIATION OF LIGHT, FILM, LAMINATE AND PRODUCTION OF MULTILAYER WIRING BOARD

[75] Inventors: Masaki Morita; Shin Takanezawa, both of Shimodate; Takashi Yamadera, Tsukuba; Kazumasa Takeuchi, Yuki; Shuuichi Hatakeyama, Shimotsuma, all of Japan

[73] Assignee: Hitachi Chemical Company, Ltd., Tokyo, Japan

[21] Appl. No.: 09/124,016

[22] Filed: Jul. 29, 1998

[30]   Foreign Application Priority Data

Jul. 31, 1997  [JP]  Japan .................................. 9-205130
Jul. 31, 1997  [JP]  Japan .................................. 9-205132

[51] Int. Cl.$^7$ ................................................... C08G 69/26
[52] U.S. Cl. ............................................ 528/353; 528/167
[58] Field of Search .................................. 528/167, 353

[56]           References Cited

U.S. PATENT DOCUMENTS

| | | | |
|---|---|---|---|
| 4,110,364 | 8/1978 | Gaku et al. ............................. | 528/170 |
| 4,389,516 | 6/1983 | Sugio et al. ............................ | 525/534 |
| 4,925,915 | 5/1990 | Mueller et al. ......................... | 528/353 |
| 4,975,471 | 12/1990 | Hayase et al. ......................... | 522/13 |
| 5,464,726 | 11/1995 | Gelorme et al. ....................... | 430/326 |
| 5,578,697 | 11/1996 | Kawamonzen et al. ............... | 528/353 |

*Primary Examiner*—Terressa M. Boykin
*Attorney, Agent, or Firm*—Antonelli, Terry, Stout & Kraus, LLP

[57]           ABSTRACT

A resin composition which can be cured by application of heat or irradiation of light, comprising (A) a bismaleimide compound, (C) an acridine compound represented by the formula (1) or (2) as an thermosetting accelerator or a photo-polymerization initiator, and (B) an optional resin ingredient other than (A); a film and laminate produced by using the resin composition; and a method of producing a multilayer wiring board by using the resin composition as a material of insulating layers:

(1)

(2)

wherein $R_2$, $R_3$, $R_4$, $R_5$, $R_7$, $R_8$ and $R_9$ are hydrogen, a halogen, an alkyl or alkoxy group, $R_1$ is an alkyl group, and $R_{10}$ is an alkylene group.

35 Claims, 2 Drawing Sheets

RESIN COMPOSITION WHICH CAN BE CURED BY APPLICATION OF HEAT OR IRRADIATION OF LIGHT, FILM, LAMINATE AND PRODUCTION OF MULTILAYER WIRING BOARD

BACKGROUND OF THE INVENTION (a) Field of the Invention

The present invention relates to resin compositions which contain bismaleimide compounds and can be cured by application of heat or irradiation of light, and to films and laminates produced by using them, particularly to novel resin compositions which are rendered low temperature-thermosetting and photo-curing by combining bismaleimide compounds with novel accelerators, and are particularly useful for the production of laminates and printed wiring boards. The present invention also relates to the production of multilayer wiring boards by a build-up process using such resin compositions.

(b) Description of the Related Art

In the production of laminates and printed wiring boards, thermosetting resins including epoxy resins, phenolic resins, melamine resins and bismaleimide compounds are extensively used as insulating materials. Among all, bismaleimide compounds render particularly high-heat resistance, and are common main ingredients in insulating materials of a high-heat resistance grade.

In practical applications, bismaleimide compounds are cured by dimerization utilizing the splitting of unsaturations or by crosslinking through the Michael addition of active amines. An exemplar literature is "The Newest Heat Resistant Resin", Edit. Satoru Mita, p42, Bismaleimide resins (Sogo Gijutsu Center Co., Ltd., May, 1987).

Particularly, in the industries of insulating substrates and laminates, bismaleimide compounds are marketed as poly-imide laminating materials in combination with modifiers, such as epoxy resins. Because of their excellent heat resistance, they are used for applications requiring high reliability, such as wiring boards for super computers or airplanes.

The double bonds contained in bismaleimide compounds, however, have low reactivity, requiring heating for a long time at high temperatures to thermoset. Thus radical initiators, such as peroxides, are generally added, even which require heating for a long time at high temperatures, causing the warp and contraction of substrates.

There are also an increasing demand for photo-curing insulating materials for solder resist, and it has been tried actively to use photosensitive resins not only as the conventional surface insulating materials, such as solder resist, but also as interlayer-insulating or -connecting materials.

For example, common multilayer wiring boards are produced by superposing sequentially an insulating substrate bearing an internal circuit layer, prepregs prepared by impregnating glass fabric with an epoxy resin followed by semi-cure, and a copper foil, pressing them with heat, drilling to make through holes for interlayer connection, electroless-copper-plating the copper foil surface and the internal walls of the through holes, optionally electro-copper-plating to a thickness required of circuit conductor, and removing unnecessary copper. As electronic instruments have been downsized, lightened and made multifunctional increasingly, LSIs and chip components are also increased in integration, accompanied by rapid changes in shape, such as downsizing and increased pins. This accelerates the fine wiring of multilayer wiring boards and increases the packaging density of electronic components. However, there is a limit in decreasing wiring pitch with the current techniques, which permit wiring pitches of 75 to 100 $\mu$m for mass production. This makes it difficult to significantly increase the wiring density by mere reduction of wiring pitch. The improvement in wiring density is also inhibited by through holes which occupy an area of about 300 $\mu$m diameter per hole. Through holes have such a large diameter since they are generally made by mechanical drilling, narrowing room for wiring design. As a means for solving these problems, Japanese Patent Examined Publication No. 4-55555 and Japanese Patent Unexamined Publication No. 63-126296 disclose photo-processing methods of making via holes for interlayer connection in photosensitive insulating resin layers provided on insulating substrates.

Conventional thermosetting materials themselves, however, have no photo-curability and inapplicable for the above purpose. To the contrary, most of conventional photosensitive materials of resist have enough photo-curability, but are hardly applicable to the above purpose due to lack of the properties of insulating materials, particularly heat resistance and moisture resistance.

According to a known attempt to make the conventional thermosetting materials photo-curable, epoxy resins are combined with photo-cation precursors. The photo-sensitivity of this system, however, is so poor as to require a large light energy even to induce insufficient cure reaction. Thus it is the fact that the properties of cured products are considerably inferior to thermoset products. So this technique has found little applications, particularly in applications requiring fine patterning, though long years have passed after its publication.

In multilayer wiring boards, the thin insulating layers 50 to 100 $\mu$m thick need to be composed of materials having good heat resistance. Therefore, bismaleimide compounds are useful thermosetting materials of insulating layers to impart good heat resistance. Bismaleimide compounds, however, are too poor in reactivity to polymerize or dimerize them by using photo-polymerization initiators, and have been added to photo-cure systems merely as thermosetting ingredients.

As described above, the cure reactions of thermosetting materials involve problems. Particularly, both the thermosetting and photo-cure reactions of bismaleimide materials involve problems, so that bismaleimide materials have found little applications in the fields of laminates and printed wiring boards, except for the use as imide laminate materials.

SUMMARY OF THE INVENTION

An object of the present invention is to improve the curability of thermosetting materials containing bismaleimide compounds while making use of the high heat resistance of bismaleimide compounds. Another object of the present invention is to render bismaleimide compounds photo-curable without deteriorating their thermosetting properties.

Another object of the present invention is to provide a method of producing a multilayer wiring board, wherein the improved bismaleimide compound-containing resin composition is used to form insulating layers excelling in heat resistance and electric properties and to permit making via holes by photolithography.

In the course of study to cure bismaleimide compounds at lower temperatures, we have found that a novel cure system, which is different from the conventional cure accelerating system using peroxides, accelerates the cure of bismaleimide compounds, lowers dramatically the cure onset temperature, and as well permits photo-curing bismaleimide compounds.

That is, the present invention provides a resin composition which can be cured by application of heat or irradiation of light, comprising (A) 100 parts by weight of a bismaleimide compound and (C) 0.1 to 30 parts by weight of an acridine compound represented by the formula (1) or (2) as an thermosetting accelerator or a photo-polymerization initiator:

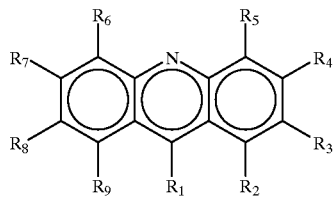

(1)

wherein $R_2$, $R_3$, $R_4$, $R_5$, $R_6$, $R_7$, $R_8$ and $R_9$ are each independently hydrogen, a halogen, an alkyl or alkoxy group of 1 to 8 carbon atoms, and $R_1$ is an alkyl group of 1 to 8 carbon atoms,

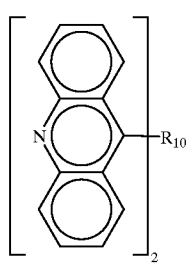

(2)

wherein $R_{10}$ is an alkylene group of 1 to 12 carbon atoms.

The present invention further provides a resin composition which can be cured by application of heat or irradiation of light, comprising (A) 5 to 90 parts by weight of a bismaleimide compound, (B) 10 to 95 parts by weight of a resin ingredient other than the (A) bismaleimide compound, and 0.1 to 30 parts by weight of (C) an acridine compound represented by the formula (1) or (2) as an thermosetting accelerator or a photo-polymerization initiator, with a proviso that a total of the (A) bismaleimide compound and the (B) resin ingredient is 100 parts by weight.

The present invention further provides a film produced by coating a surface of a support with any of above resin compositions, and then drying the coating of the resin composition.

The present invention further provides a laminate comprising a substrate and a patterned layer of a cured product of any of the above resin compositions, produced by forming a layer of the resin composition, partially photo-curing the layer of the resin composition by irradiation of light, removing a part of the layer of the resin composition where the resin composition did not undergo photo-cure, by development, and then further thermosetting the layer of the resin composition with heat.

The present invention further provides a method of producing a multilayer wiring board, comprising preparing a insulating substrate bearing on a surface thereof a first circuit, forming an insulating layer, which comprises the resin composition comprising (A) 5 to 90 parts by weight of a bismaleimide compound, (B) 10 to 95 parts by weight of a resin ingredient other than the (A) bismaleimide compound, and 0.1 to 30 parts by weight of (C) an acridine compound represented by the formula (1) or (2) as an thermosetting accelerator or a photo-polymerization initiator, with a proviso that a total of the (A) bismaleimide compound and the (B) resin ingredient is 100 parts by weight, on the surface of the insulating substrate bearing the first circuit, making a via hole in the insulating layer, carrying out copper-plating to form a second circuit on the insulating layer and to make interlayer-connection through the via hole.

DESCRIPTION OF THE PREFERRED EMBODIMENTS

Figure 1A:
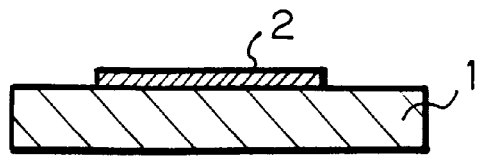
FIG. 1(a)–FIG. 1(h) show cross-sectional views of steps of producing a multilayer wiring board according to an embodiment of the present invention.

The resin composition of the present invention comprises (A) a bismaleimide compound as a thermosetting material, (C) an acridine compound represented by the formula (1) or (2) as a thermosetting accelerator or as a photo-polymerization initiator, and optionally (B) a resin ingredient other than the bismaleimide compound as a modifier for improving properties, and can be cured by application of heat or by irradiation of light.

Bismaleimide compounds generally need high cure temperatures ranging from 170° C. to 220° C. since the ring opening and crosslinking of bismaleimide compounds are insufficient at low temperatures. When cured by themselves, they need a higher temperature and a longer cure time.

To accelerate the cure reactions, peroxides have commonly been added. They increase the crosslinking density, but cannot cause cure at low temperatures of 100° C. or lower. Therefore, peroxides with high decomposition temperatures are selected, and the thermosetting reactions are generally carried out at 170° C. or higher.

We have found that the acridine compounds of the formula (1) or (2) make bismaleimide compounds to undergo exothermic crosslinking readily at lower temperatures. This crosslinking can be confirmed easily by using thermal analyzers, such as DSC (differential scanning calorimeter). For example, when a mixture of a bismaleimide compound with an acridine compound is heated in a stream of nitrogen, clear exothermic due to the onset of cure is observed at 80° C. to 100° C. The exothermic is observed continuously up to 180° C., and it is presumed that the bismaleimide compound is crosslinked by the interaction between the bismaleimide compound and the acridine compound. The onset of crosslinking of bismaleimide compounds at such low temperatures has not been known.

Some acridine compounds are also known as photo-polymerization initiators for radical polymerization. For example, in Japanese Patent Application Unexamined Publication No. 5-224413 is reported that combinations of α, ω-di-9-acridinylalkanes and unsaturated compounds are highly sensitive photo polymerization systems. The unsaturated compounds, however, are acrylic monomers, which have highly active unsaturations and are readily polymerized at room temperature. Bismaleimide compounds have been presumed not to be suited for photo-curing systems since the unsaturations in bismaleimides barely allow the dimerization caused by direct splitting at high temperatures, and hardly crosslink even by irradiation of high light energy.

Therefore, it is surprising that the resin composition of the present invention comprising an acridine compound and a bismaleimide compound undergoes highly sensitive photo-cure. Even after photo-cure, the resin composition further cures with heat because most of the acridine compound, which mainly absorbs the irradiation, remains as it is.

The resin composition of the present invention is applicable not only to a low temperature cure system but also to a two-stage cure system by combining the low temperature cure with photo-cure. Resin compositions capable of curing either with heat or light can provide industrially useful applications by making use of their characteristic curability. For example, after a selective photo-cure of such resin compositions, unreacted parts, generally unexposed parts, are selectively removed by using a proper dissolving developer, and then the remaining parts are cured with heat to complete the cure process. This is called photolithography, whereby the resin composition of the present invention containing bismaleimide compounds can be used as a photosensitive resin. Also, as a thermosetting resin, the resin composition gives full play to its characteristic low temperature curability in the above process.

Though the above effect can be made by the combination of the bismaleimide compound and the specific acridine compound, which are the essential components in the present invention, more effects can be made by adding (B) a resin ingredient other than the bismaleimide compound to modify the properties of the non-cured composition or the cured product.

Since the curability of the resin composition is due to the completely different combination from the conventional thermosetting or photo-cure systems, the conventional cure systems can be added as they are. For example, other thermosetting resins or resin systems can be added to improve the thermosetting. For this purpose, the techniques that are common in the modification of thermosetting bismaleimide resins may be used.

Various combinations used in conventional photo-cure systems can also be added to the resin system of the present invention, because bismaleimide compounds are less reactive, substantially inert, in conventional photo polymerization systems. Thus the resin composition of the present invention can be furnished with various properties without deteriorating the photo-curability, the thermosetting and the low temperature curability, to extend its applications.

The cause of the photo-curability, the thermosetting and the low temperature curability attained by this invention is not yet elucidated, but it is presumed that the combination of bismaleimide compounds, which have the properties of acceptors due to low electron density, with acridine compounds, which exhibit strongly the properties of donors at the normal and a photo-excited state, induces the formation of active substances, such as charge transfer complexes, at relatively low temperatures, contributing the low temperature curability and the photo-curability.

Exemplary bismaleimide compounds usable in the present invention include m-di-N-maleimidylbenzene, bis(4-N-maleimidylphenyl)methane, 2,2-bis(4-N-maleimidylphenyl)propane, 2,2-bis(4-N-maleimidyl-2,5-dibromophenyl)propane, 2,2-bis[4-(4-N-maleimidylphenoxy)phenyl]propane and 2,2-bis(4-N-maleimidyl-2-methyl-5-ethylphenyl)propane, which may be used individually or as a mixture of two or more. These bismaleimide compounds may also be used in a modified form, for example, as reaction products of them with various resins, such as the reaction products of the double bonds of these bismaleimide compounds with amino resins, rubbers or epoxy resins.

Exemplary acridine compounds represented by the formula (1) include 9-methylacrydine, 9-ethylacridine, 9-butylacridine and 3,6-diethoxy-9-methylacridine.

Exemplary acridine compounds represented by the formula (2) include 1,2-di-9-acridinylethane, 1,3-di-9-acridinylpropane, 1,4-di-9-acridinylbutane, 1,7-di-9-acrydinylheptane and 1,8-di-9-acrydinyloctane.

These acridine compounds may be used individually or in combination of two or more.

Examples of resins or compounds which are usable as the (B) resin ingredient other than the (B) bismaleimide compound may be roughly classified to the following five groups.

The first group includes epoxy resins, for example, bisphenol A epoxy resins, bisphenol F epoxy resins, bisphenol S epoxy resins, bisphenol AF epoxy resins, bisphenol AD epoxy resins, phenol novolac epoxy resins, cresol novolac epoxy resins, aliphatic epoxy resins, alicyclic epoxy resins, glycidyl ester-type epoxy resins, glycidylamine-type epoxy resins, heterocyclic epoxy resins, epoxidized polybutadiene resins, brominated epoxy resins obtainable by brominating the above epoxy resins; rubber-modified epoxy resins; and carboxylic acid-modified epoxy resins obtainable by modifying the above epoxy resins with carboxylic acids. In cases where the resin composition is to be photo-cured by irradiation of light, modification products of the above epoxy resins with carboxylic acids, particularly with vinyl-polymerizable unsaturated carboxylic acids, are desirable.

Examples of the unsaturated carboxylic acids include maleic anhydride, tetrahydrophthalic anhydride, itaconic anhydride, acrylic acid and methacrylic anhydride. Unsaturated carboxylic acid-modified epoxy resins are obtainable by allowing an epoxy resin to react with an unsaturated carboxylic acid in a molar ratio of carboxyl group/epoxy group of 1/1 or less, preferably 1/1 to 0.5/1.

After photo-cure, the resin composition containing an epoxy resin which is not modified with carboxylic acids can be patterned by removing unreacted parts by using a solvent, such as cyclohexanone or butyl carbitol. The resin composition containing a carboxylic acid-modified epoxy resin can be patterned by using an inexpensive, common developer, such as an aqueous alkali, an aqueous developer or a quasi-aqueous developer. Particularly, unsaturated carboxylic acid-modified epoxy resins advantageously improve the photo-reactivity of the resin composition.

The second group of the resins useful as the (B) resin ingredient includes resins having phenolic hydroxyl groups, such as phenolic resins, alkylphenolic resins, novolac phenol resins, acid-modified novolac phenol resins, bisphenol A and tetrabromobisphenol A. These may be used individually or in combination of two or more, or as modified resins, such as partial condensation products of the above phenolic resins with epoxy resins.

The third group of resins useful as the (B) resin ingredient includes other thermosetting resins, such as melamine resins and cyanate ester resins. These resins are used preferably in combination with the above phenolic resins (the resins of the second group).

The fourth group includes flexibilizers. It is possible to use various flexibilizers which have been used to compensate bismaleimide compounds for their brittleness. Examples of the flexibilizers include rubbers, such as acrylonitrile-butadiene rubbers, butadiene-acrylonitrile rubbers, natural rubbers, acrylic rubbers, SBR, carboxylic acid-modified acrylonitrile-butadiene rubbers, carboxylic acid-modified butadiene-acrylonitrile rubbers, carboxylic acid-modified acrylic rubbers, crosslinked NBR particles and carboxylic acid-modified crosslinked NBR particles. The carboxylic acid-modified rubbers preferably contains 0.1 to 20 mol % of a carboxylic acid units. Exemplary carboxylic acids usable for the modification of rubbers include acrylic acid, methacrylic acid, maleic anhydride, fumaric acid and tetrahydrophthalic anhydride.

The fifth group useful as the (B) resin ingredient includes photo-curing materials, namely compounds containing at least one vinyl-polymerizable unsaturation per molecule. These compounds are preferably used in combination with those of the first to fourth groups to balance the thermosetting and photo-curing of the resin composition. Any known compound containing at least one vinyl-polymerizable unsaturation per molecule may be used as the photo-curing material. Examples of such compounds include acrylate monomers, such as $C_{1-8}$-alkylesters of (meth)acrylic acid and 2,2-bis[4-(methacryloxyethoxy)phenyl]propane, acrylate oligomers, epoxy acrylates which are (meth)acrylic acid adducts of diglycidyl ethers of dihydric phenols, such as bisphenol A, novolac epoxy acrylates which are (meth)acrylic acid adducts of novolac epoxy resins. Particularly, acrylate monomers and acrylate oligomers with a polymerization degree of 2 to 10 are suited for rendering moderate flexibility and film formability to resin compositions which are composed mainly of solid resins and lack film formability at room temperature.

The resin composition comprising the above components (A), (B) and (C) can be made into flexible film by applying it onto a support, such as polyethyleneterephthalate film, using a film forming technique, such as bar coating. The film can be wound up by itself or together with a protection film laminated thereon, and can be used as a photosensitive resin film. Then the film can be laminated on other substrates by using a simple instrument, such as a laminator.

The (B) resin ingredient may be mixed with the (A) bismaleimide and the (B) acridine compound as it is, or after partially modified by heating (cooking). In the latter case, the (B) resin ingredient may be semi-cured to B-stage.

By adding such various resin ingredients, cured products can be furnished with various properties, maintaining the fundamental properties, photo-curing and thermosetting. For example, epoxy resins and phenolic resins render good electric insulating properties to cured products, to suit them to laminates and wiring boards. Rubbers make cured products tough, and as well enable the surfaces of cured products to be roughened easily by surface treatments using oxidizing liquid, such as sulfuric acid or chromic acid, to improve adhesion to adhesives, insulating resins or plated metals. This means that the resin composition containing rubbers can be used as an adhesive material. When a cured product of a resin composition containing a carboxylic acid-modified acrylonitrile-butadiene rubber was subjected to a surface treatment known as a desmearing treatment by using an alkaline permanganic acid solution which has been conventionally used as an oxidizing liquid in the production of wiring boards, fine irregularities were produced in the treated surface. When the surface-roughened cured product was electroless-copper-plated and electro-copper-plated by common techniques, it exhibited good adhesion (peel strength) to plated copper.

In cases where the above various thermosetting resins or photo-curing ingredients are added as the (B) resin ingredients to the resin composition of the present invention, it is desirable to add cure accelerators effective to these resin ingredients. Particularly, such cure accelerators are essential for those which do not directly react with the bismaleimide compound nor the acridine compound.

Photo-curing ingredients need no additional photo-polymerization initiators since the acridine compound works as a photo-polymerization initiator also for their photo polymerization, but additional photo-polymerization initiators may be added for various purposes, for example, to control spectral sensitivity or to control the photo sensitivity of the resin composition.

Some resin compositions containing many kinds of curable ingredients as the (B) resin ingredient undergo dark reactions depending on the combination of the curable ingredients. In such cases, it is desirable to prepare a multiple-part composition, that is, to divide all components into separate parts each causing no dark reaction and then mix all parts at the time of use. When the resin composition includes no combination causing dark reactions, all ingredients may be blended at the same time.

The resin composition of the present invention comprising the (A) bismaleimide compound and the (C) acridine compound, comprises 100 parts by weight of the (A) bismaleimide compound and 0.1 to 30 parts by weight, preferably 0.5 to 25 parts by weight of the (B) acridine compound of the formula (1) or (2), which works as a thermosetting accelerator or as a photo-polymerization initiator. Less than 0.1 parts by weight of the (C) acridine compound is ineffective, and more than 30 parts by weight of the (C) acridine compound tends to deteriorate storage stability. The optimal ratios of the bismaleimide compound to the acridine compound depends on the objective ratios between thermal reactivity and photo reactivity. When photo reactivity is mainly required, the acridine compound need not be used abundantly since it is highly capable of absorbing light and initiating photo-polymerization. When thermal reactivity is mainly required, it is desirable for effective cure to use the acridine compound in a relatively large amount.

The resin composition of the present invention comprising the (A) bismaleimide compound, the (B) resin ingredient and the (C) acridine compound, comprises 5 to 90 parts by weight of the (A) bismaleimide compound, 10 to 95 parts by weight of the (B) resin ingredient and 0.1 to 30 parts by weight of the (C) acridine compound, with the proviso that the total of (A) and (B) is 100 parts by weight. The (A) bismaleimide compound is preferably 10 to 60 parts by weight. If the (A) bismaleimide compound is less than 5 parts by weight, it cannot exhibit its characteristics. More than 90 parts by weight of the bismaleimide compound increases the glass transition temperature of cured products, but rather makes the cured products shrank or brittle.

The amount of the (C) acridine compound of the formula (1) or (2) is 0.1 to 30 parts by weight, preferably 0.2 to 20 parts by weight, more preferably 0.5 to 10 parts by weight, per 100 parts by weight of the total of the (A) bismaleimide compound and the (B) resin ingredient. Less than 0.1 parts by weight of the (C) acridine compound is ineffective, and more than 30 parts by weight of the (C) acridine compound tends to deteriorate storage stability. The optimal ratios of the bismaleimide compound to the acridine compound depends on the objective ratios between thermal reactivity and photo reactivity. When photo reactivity is mainly required, the acridine compound need not be used abundantly since it is highly capable of absorbing light and initiating photo-polymerization. When thermal reactivity is mainly required, it is desirable for effective cure to use the acridine compound in a relatively large amount.

The (B) resin ingredient preferably comprises 10 to 40% by weight, more preferably 20 to 35% by weight of the above described rubber ingredient (the fourth group), particularly at least one of the carboxylic acid-modified rubbers, and 60 to 90% by weight, more preferably 65 to 80% by weight of at least one resin ingredient having at least one vinyl-polymerizable unsaturation. Herein, resin ingredients having at least one vinyl-polymerizable unsaturation include, for example, the above-described unsaturated carboxylic acid-modified epoxy resins of the first group and the resins and compounds of the fifth group.

An example of the preferred (B) resin ingredient comprises 10 to 40% by weight, preferably 20 to 35% by weight of the rubber ingredient, 30 to 90% by weight, preferably 35 to 80% by weight of the epoxy resin ingredient (the first group), particularly at least one of the unsaturated carboxylic acid-modified epoxy resin, and 0 to 30% by weight, more preferably 0 to 20% by weight of at least one of the compound or resin of the fifth group.

Another example of the preferred (B) resin ingredient comprises 10 to 40% by weight, preferably 20 to 35% by weight of the rubber ingredient and 60 to 90% by weight, preferably 65 to 80% by weight of at least one of the compound or resin of the fifth group.

The thermosetting conditions for the resin composition of the present invention depend on the presence or the kind of the (B) resin ingredient, but the thermosetting reaction occurs at about 100° C. or higher. It, however, is necessary to consider the curing temperatures of the (B) resin ingredient and whether the cured product has satisfactory properties. The glass transition temperature of cured products typically depends on the curing temperature, and good properties are not ensured by cure at too low temperatures. The preferred thermosetting temperature, therefore, is 120° C. or higher. Higher temperature advantageously decreases the curing time, but temperatures higher than 200° C. is not necessary since the thermal degradation of the (B) resin ingredient occurs. The preferred thermosetting temperature is 100 to 200° C., more preferably 130° C. to 180° C. Such thermosetting temperature is lower compared with the conventional bismaleimide resins, showing the low temperature curability of the resin composition of the present invention. The thermosetting time depends on the thermosetting temperature, and is generally 15 minutes to 2 hours, preferably 30 minutes to 1 hour at the temperatures of the above described range.

The photo-curing conditions depend on the kind of the (B) resin ingredient or whether development is to be carried out, and photo-cure is not essential since the resin composition of the present invention can be cured by thermosetting alone. Photo-cure is generally carried out by using UV light, electron-beam or X-ray. The light energy necessary for the photo-cure is generally 5 mJ/cm$^2$ to 3,000 mJ/cm$^2$. The resin composition containing unsaturated carboxylic acid-modified epoxy resins is preferably exposed to a light of 100 mJ/cm$^2$ to 800 mJ/cm$^2$, and can be patterned by using a quasi-aqueous developer (e.g. an aqueous solution containing 10% by weight diethylene glycol monobutyl ether and 0.8% by weight borax; 35° C.).

Developers suitable for the resin composition comprising the (A) bismaleimide compounds and the (C) acridine compound are organic solvents, such as diethylene glycol monobutyl ether, diethylene glycol monoethyl ether, diethylene glycol monobutyl ether acetate, ethyl cellosolve and cellosolve acetate. Preferred examples of developers suitable for the resin composition comprising the (A) bismaleimide compound, the (B) resin ingredient and the (C) acridine compound are quasi-aqueous developers which are aqueous solutions containing 5 to 20% by weight of an organic solvent, such as the above-described solvents, and 0.1 to 10% by weight of an alkali compound, such as borax, sodium tetraborate, sodium carbonate or sodium hydroxide.

The resin composition of the present invention may contain common additives including polymerization stabilizers, such as 4-phenoxyaniline, leveling agents, pigments and dyes. The amount of each additive in the resin composition of the present invention is preferably 0.01 to 10% by weight. Fillers may also be added. Examples of fillers include inorganic fine particles, such as silica, fused silica, talc, alumina, alumina hydrate, barium sulfate, calcium hydroxide, aluminum hydroxide, Aerosil, calcium carbonate, organic fine particles, such as powdery epoxy resins and powdery polyimides, and powdery Teflon. These fillers may be treated with coupling agents. These fillers are dispersed in the resin composition by any known kneading technique, using, for example, a kneader, a ball mill, a bead mill or a three-roll roller. The amount of fillers in the resin composition of the present invention is preferably 5 to 40% by weight, more preferably 10 to 30% by weight.

The resin composition of the present invention is generally dissolved in a solvent, such as cyclohexanone, methyl ethyl ketone, toluene or acetone, applied onto a substrate, dried to remove the solvent to form a coating, and then cured. Alternatively, a film is produced as described above by providing a coating of the resin composition onto a support, and the coating is then transferred onto a substrate. Supports suitable for the film are transparent films, including a polyolefin, such as polyethylene or polypropylene, or polyethyleneterephthalate. Such transfer film is generally produced by applying a varnish of the resin composition dissolved in a solvent, and then drying the coating by heating at 50 to 150° C., preferably 70 to 120° C., for 2 to 60 minutes, preferably 5 to 30 minutes. By the heating, the solvent is removed, and the resin composition may be semi-cured to B-stage, but must not be completely cured to C-stage. The substrate may be any one which can bear the coating, for example, an insulating substrate such as a plastic substrate or a glass substrate, a metal substrate, a laminate or a printed wiring board. In cases where a laminate or a printed wiring board is used as the substrate, the resin composition of the present invention works as an insulating material for build-up wiring boards because it can form an insulating layer covering a pre-formed wiring board.

In the method of producing a multilayer wiring board according to the present invention is used the above-described resin composition comprising 5 to 90 parts by weight of the (A) bismaleimide compound, 10 to 95 parts by weight of the (B) resin ingredient other than (A) and 0.1 to 30 parts by weight of the (C) acridine compound represented by the formula (1) or (2), with the proviso that the total of (A) and (B) is 100 parts by weight.

In the method of the present invention, via holes may be made by drilling or laser, preferably by photolithography, whereby fine via holes can be made with high accuracy by exposing the insulating layer to light and then developing.

FIG. 1(a)–FIG. 1(h) show an embodiment of the present invention wherein via holes are made by photolithography.

First an insulating substrate 1 bearing a first circuit 2 is prepared (FIG. 1(a)). The insulating substrate 1 may be any insulating substrate commonly used in wiring boards, such as glass fabric-epoxy resin, paper-phenolic resin, paper-epoxy resin or glass fabric glass paper-epoxy resin.

The first circuit 2 may be produced by any method common in the production of wiring boards, for example, by a subtractive technique by using copper-clad laminate comprising the insulating substrate 1 and a copper foil applied thereon, and removing unnecessary parts of the copper foil by etching, or by an additive technique wherein a circuit is formed by electroless-copper-plating necessary parts of the insulating substrate 1.

Figure 1E:
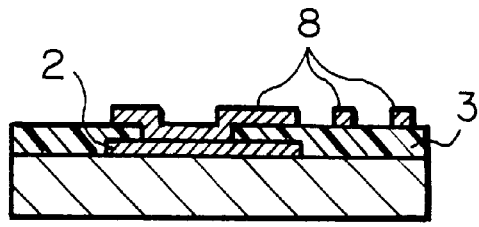
Figure 1B:
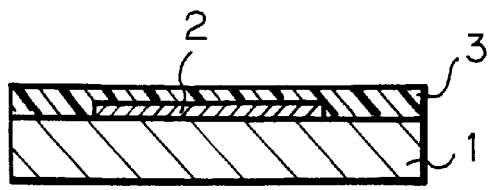

An insulating layer 3 composed of the resin composition of the present invention is then formed on the surface of the insulating substrate 1 bearing the first circuit 2 (FIG. 1(b)). The insulating layer 3 may be made by applying a liquid resin composition or a resin composition varnish by roll coating, curtain coating or dip coating, followed by drying, or by laminating a film of the resin composition. After drying and before exposure to light, the insulating layer 3 is preferably 10 to 150 μm thick, more preferably 25 to 100 μm thick.

Figure 1F:
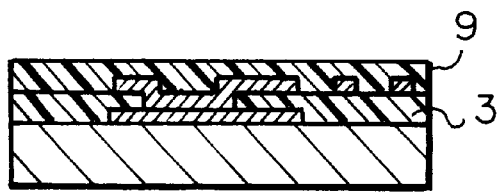
Figure 1C:
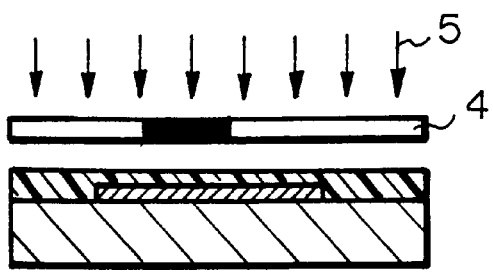

The insulating layer 3 is exposed to light 5 through a photo mask (4) (FIG. 1(c)), and then the unexposed part is etched with a developer to make a via hole 6 for connecting the first circuit 2 and a subsequent circuit. Exposure may be carried out by any method commonly used to form resist on wiring boards. The developer used to etch the unexposed part is selected from the above described alkali developers, quasi-aqueous developers, organic solvents and so on, depending on the developing type of the resin composition used form the insulating layer 3.

Subsequently, the production of a second circuit on the insulating layer 3 and the interlayer-connection through the via hole 6 are carried out, preferably after the surface of the insulating layer 3 is roughened mechanically, for example by buffing, or chemically. For example, after the surface of the insulating layer 3 is treated with an oxidizing roughening liquid to form a roughened face 7 (FIG. 1(d)), it is copper-plated to make a second circuit 8 and the interlayer-connection through the via hole 6 (FIG. 1(e)). Before the roughening, the insulating layer 3 may be after-cured by irradiation of light (e.g. UV light) of 500 to 4000 mJ/cm$^2$ and heating at 100 to 200° C. for 1.5 to 2 hours, or by such heating alone.

Examples of usable oxidizing roughening liquids include chromium/sulfuric acid roughening liquid, alkaline permanganic acid roughening liquid, sodium fluoride/chromium/sulfuric acid roughening liquid and borofluoric acid roughening liquid. For example, the second circuit 8 is formed by coating the roughened face 7 of the insulating layer 3 with a catalyzer, copper-plating the whole surface by electroless plating, followed by optional electroplating to give a conductor layer of a desired thickness, and then removing unnecessary parts by etching; or by using an insulating layer containing a plating catalyzer, forming patterned plate resist thereon and then forming a circuit by electroless-plating the necessary parts; or by roughening an insulating layer containing no plating catalyzer, coating the roughened face with a plating catalyzer, forming patterned plate resist thereon, and then forming a circuit by electroless-plating the necessary parts.

Figure 1G:
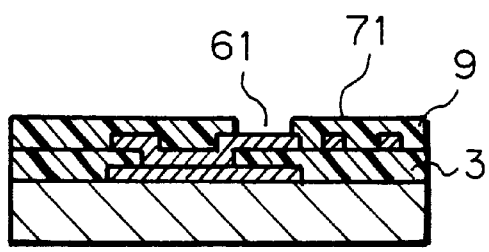
Figure 1D:
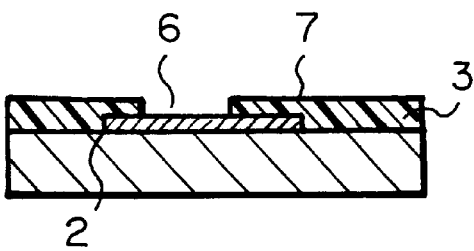
Figure 1H:
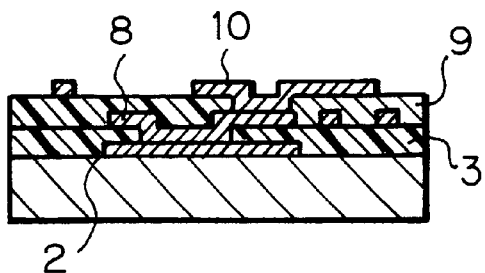

To produce multilayer wiring boards having more circuit layers, the above process (FIG. 1(b) to FIG. 1(e)) is repeated as shown in FIG. 1(f) to FIG. 1(h). In the same manner as FIG. 1(b), a second insulating layer 9 is provided on the first insulating layer 3 bearing the second circuit 8 (FIG. 1(f)). Subsequently, in the same manner as FIG. 1(c) to FIG. 1(d), a via hole 61 is made in the second insulating layer 9, followed by making a roughened face 71 (FIG. 1(g)). On the second insulating layer 9 is formed a third circuit 10, which is then interlayer-connected to the second circuit 8 through the via hole 61 (FIG. 1(h)).

Before the second and subsequent insulating layers are formed in the above process, it is preferable to roughen the surfaces of the underlying conductor circuits mechanically or chemically by oxidation using a technique common in the production of multilayer wiring boards, and reducing the oxidized surfaces with a reducing agent, such as sodium borohydride or dimethylamine borane.

According to the method of the present invention, a multilayer wiring board is produced by a build-up process using the resin composition of the present invention as the material of insulating layers, and the obtained multilayer wiring board has excellent heat resistance.

Hereinafter, the present invention will be described in detail referring to examples.

EXAMPLE 1

A resin solution of 40% by weight concentration was prepared by dissolving 96 parts by weight of 2,2-bis[4-(4-N-maleimidylphenoxy)phenyl]propane and 4 parts by weight of 1,7-di-9-acridinylheptane in cyclohexanone. The resin solution was applied to a glass plate and dried at 80° C. for 20 minutes to form a solid film, the exothermic of which was then determined in a stream of nitrogen at a temperature raising rate of 10° C./min. by using a differential scanning calorimeter (Model-910 DSC, produced by E. I. Du Pont de Nemours and Company).

EXAMPLE 2

A resin solution of 40% by weight concentration was prepared by dissolving in cyclohexanone 40 parts by weight of bis(4-N-maleimidylphenyl)methane (trade name: BMI, produced by Mitsui Toatsu Chemicals, Inc.), 55 parts by weight an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours, and 5 parts by weight of 1,7-di-9-acridinylheptane.

The resin solution was applied to a copper foil 35 μm thick to form a coating 100 μm thick, and dried at 80° C. for 15 minutes to remove the solvent. Then the whole surface was exposed to 500 mJ/cm$^2$ of UV light under vacuum, followed by thermosetting at 120° C. for 60 minutes. The copper foil of the obtained resin-coated copper foil was etched away, to give a resin film. The resin film was examined for glass transition temperature (Tg) and solvent resistance to methyl ethyl ketone by using a thermomechanical analyzer (Model-943, produced by E. I. Du Pont de Nemours and Company).

EXAMPLE 3

A resin solution of 40% by weight concentration was prepared by dissolving in cyclohexanone 40 parts by weight of 2,2-bis[4-(4-N-maleimidylphenoxy)phenyl]propane (trade name: BBMI, produced by Hitachi Chemical Company, Ltd.), 55 parts by weight an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours, and 5 parts by weight of 1,7-di-9-acridinylheptane.

The resin solution was applied to a copper foil 35 μm thick to form a coating 100 μm thick, and dried at 80° C. for 15 minutes to remove the solvent. Then the whole surface was exposed to 500 mJ/cm$^2$ of UV light under vacuum, followed by thermosetting at 120° C. for 60 minutes. The copper foil of the obtained resin-coated copper foil was etched away, to give a resin film. The resin film was examined for glass transition temperature (Tg) and solvent resistance to methyl ethyl ketone by using a thermomechanical analyzer (Model-943, produced by E. I. Du Pont de Nemours and Company).

EXAMPLE 4

A resin solution of 40% by weight concentration was prepared by dissolving in cyclohexanone 30 parts by weight of 2,2-bis[4-(4-N-maleimidylphenoxy)phenyl]propane (trade name: BBMI, produced by Hitachi Chemical Company, Ltd.), 45 parts by weight an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours, 20 parts by weight of an acid-modified acrylonitrile-butadiene rubber containing 4 mol % of carboxylic acid units in molecules (trade name: PNR-1H, produced by Japan Synthetic rubber Co., Ltd.) and 5 parts by weight of 1,7-di-9-acridinylheptane.

The resin solution was applied to a copper foil 35 μm thick to form a coating 100 μm thick, and dried at 80° C. for 15 minutes to remove the solvent. Then the whole surface was exposed to 500 mJ/cm$^2$ of UV light under vacuum, followed by thermosetting at 120° C. for 60 minutes. The copper foil of the obtained resin-coated copper foil was etched away, to give a resin film. The resin film was examined for glass transition temperature (Tg) and solvent resistance to methyl ethyl ketone by using a thermomechanical analyzer (Model-943, produced by E. I. Du Pont de Nemours and Company).

EXAMPLE 5

A resin solution of 40% by weight concentration was prepared by dissolving in cyclohexanone 30 parts by weight of 2,2-bis[4-(4-N-maleimidylphenoxy)phenyl]propane (trade name: BBMI, produced by Hitachi Chemical Company, Ltd.), 45 parts by weight an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours, 20 parts by weight of an acid-modified acrylonitrile-butadiene rubber containing 4 mol % of carboxylic acid units in molecules (trade name: PNR-1H, produced by Japan Synthetic rubber Co., Ltd.) and 5 parts by eight of 1,7-di-9-acridinylheptane.

The resin solution was applied to a release-treated polyethyleneterephthalate film (20 μm thick), and then dried at 80° C. for 15 minutes to give a film (resin composition layer: 75 μm thick). The film was laminated onto a reduction-treated copper clad laminate (trade name: MCL-E-67, produced by Hitachi Chemical Company, Ltd., total thickness: 1.0 mm, copper foil: 35 μm thick) at 120° C. by using a hot roll laminator, to give a laminate. The film was then exposed to UV light of 500 mJ/cm$^2$ under vacuum through a negative photo mask having a circular black area of 150 μm diameter. The polyethyleneterephthalate film was then removed. When an quasi-aqueous developer containing 20% by volume of 2-(2-butoxyethoxy)ethanol (diethylene glycol monobutyl ether) and 8 g/l of sodium tetraborate was sprayed against the resin layer at 35° C. for 3 minutes to examine the developing capability of the resin layer, a via hole of 150 μm diameter was made in the resin layer.

EXAMPLE 6

A resin solution of 40% by weight concentration was prepared by dissolving in cyclohexanone 30 parts by weight of 2,2-bis[4-(4-N-maleimidylphenoxy)phenyl]propane (trade name: BBMI, produced by Hitachi Chemical Company, Ltd.), 45 parts by weight an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours, 20 parts by weight of an acid-modified acrylonitrile-butadiene rubber containing 4 mol % of carboxylic acid units in molecules (trade name: PNR-1H, produced by Japan Synthetic rubber Co., Ltd.) and 5 parts by weight of 1,7-di-9-acridinylheptane.

The resin solution was applied to a release-treated polyethyleneterephthalate film (20 μm thick), and then dried at 80° C. for 15 minutes to give a film (resin composition layer: 75 μm thick). The film was laminated onto a reduction-treated copper clad laminate (trade name: MCL-E-67, produced by Hitachi Chemical Company, Ltd., total thickness: 1.0 mm, copper foil: 35 μm thick) at 120° C. by using a hot roll laminator, to give a laminate. The film was then exposed to UV light of 500 mJ/cm$^2$ under vacuum through a negative photo mask having a circular black area of 150 μm diameter. After the polyethyleneterephthalate film was removed, a quasi-aqueous developer containing 20% by volume of 2-(2-butoxyethoxy)ethanol (diethylene glycol monobutyl ether) and 8 g/l of sodium tetraborate was sprayed against the resin layer at 35° C. for 3 minutes. After drying at 80° C. for 30 minutes, after-exposure to UV light of 2,000 mJ/cm$^2$ was carried out, followed by after-heating at 120° C. for 60 minutes. The obtained substrate was buffed (#600), and then dipped in an aqueous solution containing 60 g/l of sodium permanganate and 40 g/l of sodium hydroxide at 70° C. for 10 minutes, and treated with a hydroxyamine sulfate neutralizing liquid at 50° C. for 5 minutes. After pretreatments common in general plating processes, the surface of the resin layer was plated with copper to 30 μm thick. The peel strength between the plated copper and the resin layer was 0.8 kN/m, showing good adhesion to plated copper.

COMPARATIVE EXAMPLE 1

The procedure of Example 1 was repeated except that only 2,2-bis[4-(4-N-maleimidylphenoxy)phenyl]propane (trade name: BBMI, produced by Hitachi Chemical Company, Ltd.) was used without using 1,7-di-9-acridinylhepetane, to determine the exothermic of the 2,2-bis[4-(4-N-maleimidylphenoxy)phenyl]propane.

COMPARATIVE EXAMPLE 2

The procedure of Example 1 was repeated except that only 1,7-di-9-acridinylheptane was used without using 2,2-bis[4-(4-N-maleimidylphenoxy)phenyl]propane (trade name: BBMI, produced by Hitachi Chemical Company, Ltd.), to determine the exothermic of the 1,7-di-9-acrydinylheptane.

Figure 2:
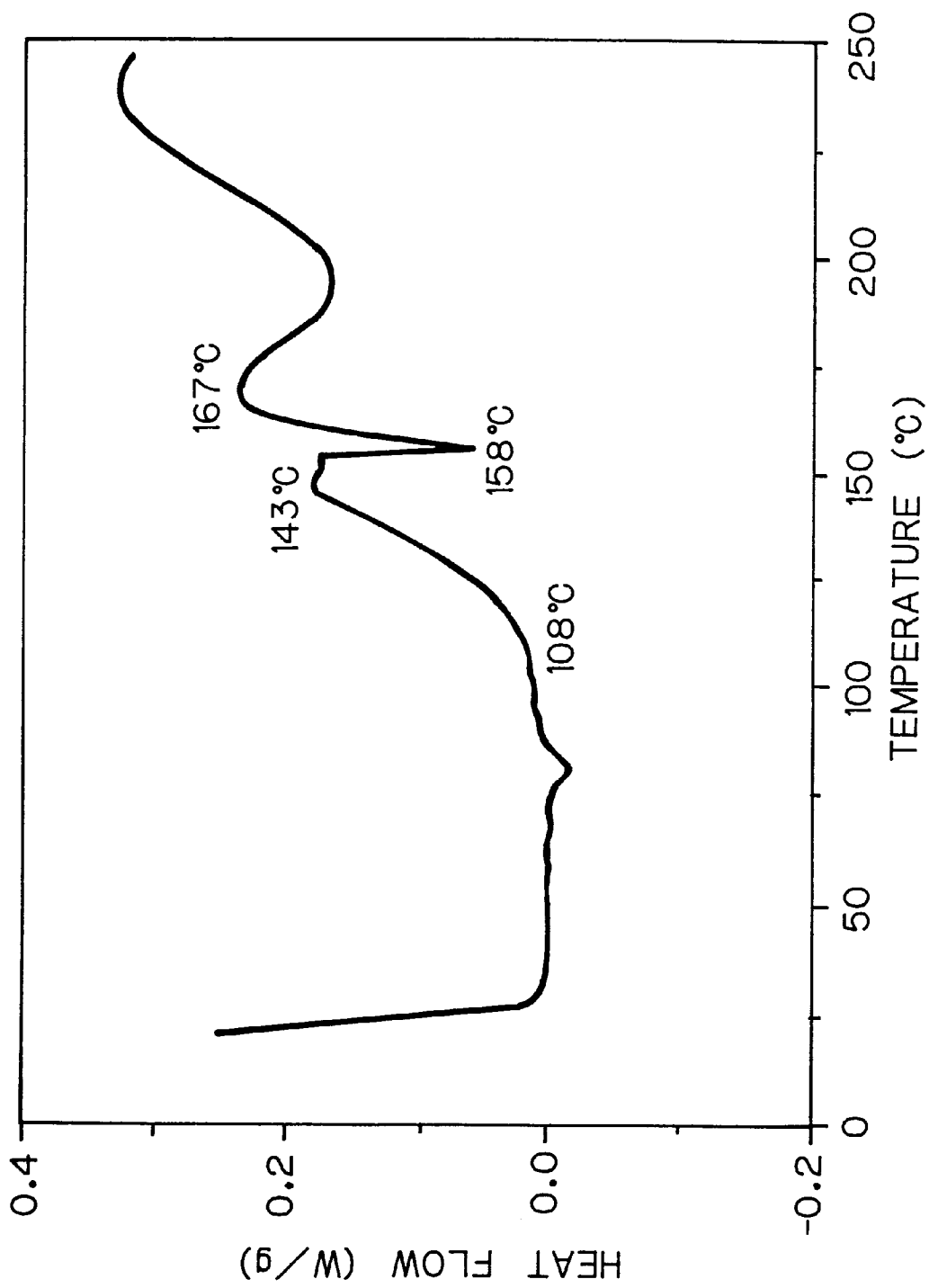
FIG. 2 is a chart showing the exothermic curve of the composition prepared in Example 1 as measured with a differential scanning calorimeter.

The results obtained in Examples 1 to 6 and Comparative Examples 1 and 2 are shown in Table 1. The chart obtained in Example 1 by the measurement using the differential scanning calorimeter is shown in FIG. 2 lent weight of 500 to react with tetrahydrophthalic anhydride in an 1/1 equivalent ratio of epoxy group/hydroxyl group at 150° C. for 10 hours:
    45 parts by weight

TABLE 1

| | Results of measurements using a differential scanning calorimeter (° C.) | | | | | | | Peel strength between |
|---|---|---|---|---|---|---|---|---|
| | Exothermic on-set Temp. | | Highest reaction Temp. | | Tg | Solvent resistance | Developing | plated copper and resin layer |
| | 1st | 2nd | 1st | 2nd | (° C.) | (MEK) | capability | (kN/m) |
| Ex. 1 | 108 | 158 | 143 | 167 | — | — | — | — |
| Ex. 2 | — | — | — | — | 165 | No change | — | — |
| Ex. 3 | — | — | — | — | 160 | No change | — | — |
| Ex. 4 | — | — | — | — | 150 | No change | — | — |
| Ex. 5 | — | — | — | — | — | — | Good | — |
| Ex. 6 | — | — | — | — | — | — | — | 0.8 |
| Comp. Ex. 1 | No exothermic peak | | | | — | — | — | — |
| Comp. Ex. 2 | No exothermic peak | | | | — | — | — | — |

Comparative Examples 1 and 2 indicate that the bismaleimide compound and the acridine compound undergo no exothermic reaction at 200° C. or lower each alone. To the contrary, Example 1 shows that when the bismaleimide compound was mixed with the acridine compound, an exothermic reaction began at 108° C., showing the first exothermic peak at 143° C. An exothermic reaction began again at 158° C., showing the second exothermic peak at 167° C., followed by continuing exothermic. This indicates that the addition of acridine compounds to bismaleimide compounds enables curing reaction to set in at low temperatures. Further, as shown in Examples 2 to 4, the cured products have high glass transition temperatures ranging from 150 to 165° C., which indicate excellent heat resistance. As shown in Example 5, the resin composition of the present invention has such a good developing capability that patterns of about 150 μm diameter can be developed with alkaline developers without any trouble, and Example 6 shows strong adhesion to plated copper.

That is, the resin composition of the present invention comprising a bismaleimide compound and a specific acridine compound can be cured not only with heat at low temperatures but also with light, while exhibiting the high heat resistance inherent to the bismaleimide compound.

EXAMPLE 7

(1) A first circuit was formed on an both-sided copper clad glass/epoxy resin laminate (trade name: MCL-E-67, produced by Hitachi Chemical Company, Ltd.) bearing both-mat faced copper foils 18 μm thick, by removing unnecessary parts of one copper foil by etching (FIG. 1(a)).

(2) A varnish of 45% by weight concentration was prepared by dissolving or dispersing the following resin composition in a solvent mixture of cyclohexanone and methyl ethyl ketone (weight ratio 1:1).
2,2-bis[4-(4-N-maleimidylphenoxy)phenyl]propane (trade name: BBMI, produced by Hitachi Chemical Company, Ltd.):
    30 parts by weight
an acid-modified epoxy resin which was synthesized by allowing a bisphenol A epoxy resin of an epoxy equivaan acid-modified acrylonitrile-butadiene rubber containing 4 mol % of a carboxylic acid units (trade name: PNR-1H, produced by Japan Synthetic Rubber Co., Ltd.)
    20 parts by weight
1,7-di-9-acridinylheptane
    5 parts by weight
aluminum hydroxide
    10 parts by weight The varnish was applied to a release-treated polyethyleneterephthalate film 25 μm thick, and dried at 80° C. for 10 minutes to form an insulating layer 60 μm thick, to give a film. The film was laminated on the above laminate at 110° C., so that the insulating layer coated the surface bearing the first circuit (FIG. 1(b)).

(3) UV light of a light energy of 300 mJ/cm² was irradiated to the first insulating layer through a photo mask shielding an area where a via hole is to be made (FIG. 1(c)). After the polyethyleneterephthalate film was removed, the shielded and unexposed part was sprayed with a quasi-aqueous developer containing 20% by volume of 2-(2-butoxyethoxy)ethanol (diethylene glycol monobutyl ether) and 8 g/l of sodium tetraborate at 35° C. for 3 minutes, to make a via hole.

(4) After-exposure was carried out by irradiating 2 J/cm² of UV light to the insulating layer.

(5) After-heating was carried out at 150° C. for 1 hour.

(6) The surface of the first insulating layer was chemically roughened by dipping the laminate in an aqueous solution containing $KMnO_4$: 60 g/l and NaOH: 40 g/l at 50° C. for 5 minutes, and then neutralizing the surface by dipping the laminate in an aqueous solution containing $SnCl_2$: 30 g/l and HCl: 300 ml/l at room temperature for 5 minutes (FIG. 1(d)).

(7) A second circuit was formed on the surface of the first insulating layer as follows. The laminate was dipped in an electroless plating catalyzer containing $PdCl_2$ (trade name: HS-202B, produced by Hitachi Chemical Company, Ltd.) at room temperature for 10 minutes, washed with water, dipped in a electroless plating liquid (trade name: L-59, produced by Hitachi Chemical Company, Ltd.) at 70° C. for 30 minutes, and then cupric sulfate-plated, to form a conductor layer 20 μm thick on the surface of the first insulating layer including the via hole.

A second circuit including the via hole connected to the first circuit was formed by forming etching resist to etch away unnecessary parts of the plated copper, carrying out etching, and then removing the etching resist (FIG. 1(e)).

(8) To add another circuit layer, the surface of the conductor forming the second circuit was roughened with copper oxide by dipping in an aqueous solution containing sodium chlorite: 50 g/l, NaOH: 20 g/l and trisodium phosphate: 10 g/l at 85° C. for 20 minutes, washing with water and drying at 80° C. for 20 minutes.

(9) The steps (2) to (7) were repeated, to produce a three-layer multilayer wiring board (FIG. 1(f) to FIG. 1(h)).

EXAMPLE 8

A three-layer multilayer wiring board was produced by the same procedure as in Example 7, except that the composition of the resin composition was changed as follows:

2,2-bis[4-(4-N-maleimidylphenoxy)phenyl]propane (trade name: BBMI, produced by Hitachi Chemical Company, Ltd.):
  30 parts by weight
an acid-modified, brominated epoxy resin which was synthesized by allowing a brominated bisphenol A epoxy resin (bromine content: 50% by weight) of an epoxy equivalent weight of 300 to react with tetrahydrophthalic anhydride in an 1/1 equivalent ratio of epoxy group/hydroxyl group at 150° C. for 10 hours:
  45 parts by weight
an acid-modified acrylonitrile-butadiene rubber containing 4 mol % of a carboxylic acid units (trade name: PNR-1H, produced by Japan Synthetic Rubber Co., Ltd.)
  20 parts by weight
1,7-di-9-acridinylheptane
  5 parts by weight
aluminum hydroxide
  10 parts by weight

EXAMPLE 9

A three-layer multilayer wiring board was produced by the same procedure as in Example 7, except that the composition of the resin composition was changed as follows:

bis(4-N-maleimidylphenyl)methane (trade name: BMI, produced by Mitsui Toatsu Chemicals, Inc.):
  40 parts by weight
an acid-modified epoxy resin which was synthesized by allowing a bisphenol A epoxy resin of an epoxy equivalent weight of 500 to react with tetrahydrophthalic anhydride in an 1/1 equivalent ratio of epoxy group/hydroxyl group at 150° C. for 10 hours:
  25 parts by weight
an acid-modified, brominated epoxy resin which was synthesized by allowing a brominated bisphenol A epoxy resin (bromine content: 50% by weight) of an epoxy equivalent weight of 300 to react with tetrahydrophthalic anhydride in an 1/1 equivalent ratio of epoxy group/hydroxyl group at 150° C. for 10 hours:
  25 parts by weight
an acid-modified acrylonitrile-butadiene rubber containing 4 mol % of a carboxylic acid units (trade name: PNR-1H, produced by Japan Synthetic Rubber Co., Ltd.):
  20 parts by weight
1,7-di-9-acridinylheptane:
  5 parts by weight
4-phenoxyaniline:
  0.1 parts by weight
silicon dioxide:
  10 parts by weight

EXAMPLE 10

A three-layer multilayer wiring board was produced by the same procedure as in Example 7, except that the composition of the resin composition was changed as follows:

2,2-bis-(4-N-maleimidyl-2-methyl-5-ethylphenyl)propane:
  40 parts by weight
an ortho-cresol novolac epoxy acrylate (trade name: EA-4400, produced by Shin-Nakamura Kagaku Co., Ltd.):
  50 parts by weight
an acid-modified acrylonitrile-butadiene rubber containing 4 mol % of a carboxylic acid units (trade name: PNR-1H, produced by Japan Synthetic Rubber Co., Ltd.):
  20 parts by weight
2,2-bis[4-(methacryloxyethoxy)phenyl]propane (trade name: BPE-100, produced by Shin-Nakamura Kagaku Co., Ltd.):
  10 parts by weight
1,7-di-9-acridinylheptane
  5 parts by weight
4-phenoxyaniline
  0.1 parts by weight
silicon dioxide
  10 parts by weight

EXAMPLE 11

A three-layer multilayer wiring board was produced by the same procedure as in Example 7, except that 5 parts by weight of 9-butylacridine was used in place of 1,7-di-9-acridinylheptane.

COMPARATIVE EXAMPLE 3

A three-layer multilayer wiring board was produced by the same procedure as in Example 7, except that benzyl dimethyl ketal (trade name: IRUGACURE 651, produced by Ciba-Geigy AG) was used in place of 1,7-di-9-acridinylheptane.

COMPARATIVE EXAMPLE 4

A three-layer multilayer wiring board was produced by the same procedure as in Example 8, except that 2,2-bis[4-(4-N-maleimidylphenoxy)phenyl]propane was not used, and that the amount of the acid-modified, brominated epoxy resin was changed to 85 parts by weight.

COMPARATIVE EXAMPLE 5

A three-layer multilayer wiring board was produced by the same procedure as in Example 7, except that 5 parts by weight of benzyl dimethyl ketal (trade name: IRUGACURE 651, produced by Ciba-Geigy AG) and 0.5 parts by weight of a peroxide (trade name: PERHEXINE 25B, produced by Nippon Yushi Co., Ltd.) were used in place of 1,7-di-9-acridinylheptane.

COMPARATIVE EXAMPLE 6

A three-layer multilayer wiring board was produced by the same procedure as in Comparative Example 5, except that the conditions of the after-heating following the after-curing were changed from 150° C.–1 hour, to 180° C.–45 minutes.

The properties of the three-layer multilayer wiring boards are shown in Table 2.

TABLE 2

| | Capability of making a via hole of 150 μm in diameter | Peel strength (kN/m) | Tg (° C.) | Solder heat resistance (second) | Interlayer insulation voltage (Ω) | Warp of substrate (mm) |
|---|---|---|---|---|---|---|
| Ex. 7 | Good | 0.8 | 140 | $\geq 60$ | $\geq 10^{12}$ | 3 |
| Ex. 8 | Good | 0.8 | 135 | $\geq 60$ | $\geq 10^{12}$ | — |
| Ex. 9 | Good | 0.9 | 145 | $\geq 60$ | $\geq 10^{12}$ | — |
| Ex. 10 | Good | 1.0 | 140 | $\geq 60$ | $\geq 10^{12}$ | — |
| Ex. 11 | Good | 0.9 | 140 | $\geq 60$ | $\geq 10^{12}$ | 2 |
| Comp. Ex. 3 | Good | 0.5 | 105 | 15 | $10^{11}$ | — |
| Comp. Ex. 4 | Poor | 0.4 | 95 | 2 | $10^{10}$–$10^{11}$ | — |
| Comp. Ex. 5 | Good | 0.7 | 95 | 25 | $10^{11}$ | — |
| Comp. Ex. 6 | Good | 0.4 | 110 | 30 | $10^{11}$ | 12 |

The properties as shown in Table 2 were determined as follows.

Capability of making a via hole of 150 μm in diameter:

The bottom of each via hole was observed with a metallurgical microscope and a scanning electronic microscope to examine the presence of remaining resin, depressions and the separation of copper. Via holes which were free of remaining resin, depressions and the separation of copper were rated "good", and those wherein remaining resin, depressions or the separation of copper were observed were rated "poor".

Peel strength:

Plated copper of 10 mm width was peeled in a direction of a 90° angle to determine the adhesion strength.

Tg (glass transition temperature):

The measurements of Tg were carried out by a tension method using a thermomechanical analyzer at a temperature raising rate of 10° C./min (from room temperature to 200° C.) (load: 5 g).

Interlayer insulation resistance:

Interlayer insulation resistance was measured by bonding leads by soldering to the first circuit and the second circuit, respectively, and applying a direct current voltage of 100 V between the first circuit and the second circuit at room temperature for one minute.

Warp of substrate:

Each substrate (400×200 mm) was placed on a horizontal platform, and the height between the platform and the highest point in the upper surface of the warped substrate was measured.

The insulation layers in the multilayer wiring boards that were produced according to the method of the present invention by using the resin compositions of the present invention comprising the (A) bismaleimide compound, the (B) resin ingredient and the (C) acridine compound as the materials of the insulation layers were excellent in the capability of making via holes of 150 μm in diameter, and had high glass transition temperatures, and the multilayer wiring boards had excellent soldering heat resistance and high interlayer insulation voltages. The multilayer wiring boards of work sizes of 400×200 mm warped little. The insulating layer and the multilayer wiring board of Comparative Example 3, wherein a common photo-polymerization initiator, benzyl dimethyl ketal, was used, were inferior in peel strength, Tg, soldering heat resistance and interlayer insulation resistance. Those of Comparative Example 4, wherein an acid-modified, brominated epoxy resin was used in place of a bismaleimide compound, were inferior in the capability of making via holes, peel strength, Tg and interlayer insulation resistance. Those of Comparative Example 5, wherein a resin composition containing an organic peroxide in addition to the ingredients of the resin composition of Comparative Example 3 was used, showed some improvement in peel strength and soldering heat resistance, but were yet inferior to Examples. Those of Comparative Example 6, wherein after-heating was carried out at a higher temperature of 180° C. for a shorter time of 45 minutes as compared to Comparative Example 5 (after-heating conditions of 150° C.–1 hour) were improved in Tg to some degree, but had a lower peel strength. Further, they are inferior to those of Examples in Tg, soldering heat resistance, interlayer insulation resistance and warp.

What is claimed is:

1. A resin composition which can be cured by application of heat or irradiation of light, comprising (A) 100 parts by weight of a bismaleimide compound and (C) 0.1 to 30 parts by weight of an acridine compound represented by the formula (1) or (2) as a thermosetting accelerator or a photo-polymerization initiator for said bismaleimide:

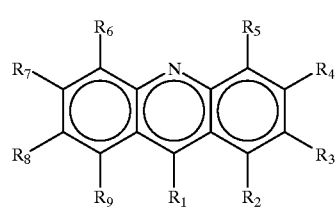

(1)

wherein $R_2$, $R_3$, $R_4$, $R_5$, $R_6$, $R_7$, $R_8$ and $R_9$ are each independently hydrogen, a halogen, an alkyl or alkoxy group of 1 to 8 carbon atoms, and $R_1$ is an alkyl group of 1 to 8 carbon atoms, (2)

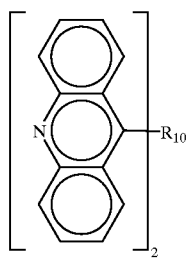

wherein $R_{10}$ is an alkylene group of 1 to 12 carbon atoms.

2. The resin composition of claim 1, wherein the (A) bismaleimide compound is selected from the group consisting of m-di-N-maleimidylbenzene, bis(4-N-maleimidylphenyl)methane, 2,2-bis(4-N-maleimidylphenyl)propane, 2,2-bis(4-N-maleimidyl-2,5-dibromophenyl)propane, 2,2-bis[4-(4-N-maleimidylphenoxy)phenyl]propane and 2,2-bis(4-N-maleimidyl-2-methyl-5-phenyl)propane, and the acridine compound is selected from the group consisting of 9-methylacridine, 9-ethylacridine, 9-butylacridine, 3,6-diethoxy-9-methylacridine, 1,2-di-9-acridinylethane, 1,3-di-9-acridinylpropane, 1,4-di-9-acridinylbutane, 1,7-di-9-acridinylheptane and 1,8-di-9-acridinyloctane.

3. A resin composition which can be cured by application of heat or irradiation of light, comprising (A) 5 to 90 parts by weight of a bismaleimide compound, (B) 10 to 95 parts by weight of a resin ingredient other than the (A) bismaleimide compound, and 0.1 to 30 parts by weight of (C) an acridine compound represented by the following formula (1) or (2) as a thermosetting accelerator or a photo-polymerization initiator for said bismaleimide compound, with a proviso that a total of the (A) bismaleimide compound and the (B) resin ingredient is 100 parts by weight:

(1)

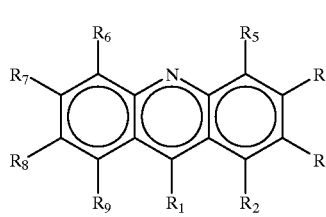

wherein $R_2$, $R_3$, $R_4$, $R_5$, $R_6$, $R_7$, $R_8$ and $R_9$ are each independently hydrogen, a halogen, an alkyl or alkoxy group of 1 to 8 carbon atoms, and $R_1$ is an alkyl group of 1 to 8 carbon atoms, (2)

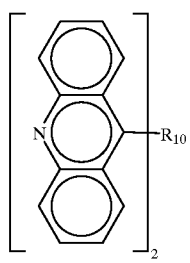

wherein $R_{10}$ is an alkylene group of 1 to 12 carbon atoms.

4. The resin composition of claim 3, wherein the (B) resin ingredient is selected from the group consisting of an epoxy resin, a modified epoxy resin, a resin having a phenolic hydroxyl group, a melamine resin, a cyanate-ester resin, a rubber, acrylate monomer, acrylate oligomer, epoxy acrylate and novolac epoxy acrylate.

5. The resin composition of claim 4, wherein the (B) resin ingredient has at least one vinyl-polymerizable unsaturation.

6. The resin composition of claim 4, wherein the (B) resin ingredient is selected from the group consisting of a vinyl-polymerizable carboxylic acid-modified epoxy resin, a carboxylic acid-modified rubber, an acrylate monomer, an acrylate oligomer, an epoxy acrylate and a novolac epoxy acrylate.

7. The resin composition of claim 6, wherein the (B) resin ingredient comprises a vinyl-polymerizable carboxylic acid-modified epoxy resin and a carboxylic acid-modified rubber.

8. The resin composition of claim 6, wherein the (B) resin ingredient comprises a carboxylic acid-modified rubber and at least one selected from the group consisting of an acrylate monomer, an acrylate oligomer, an epoxy acrylate and a novolac epoxy acrylate.

9. The resin composition of claim 3, wherein the (A) bismaleimide compound is selected from the group consisting of m-di-N-maleimidylbenzene, bis(4-N-maleimidylphenyl)methane, 2,2-bis(4-N-maleimidylphenyl)propane, 2,2-bis(4-N-maleimidyl-2,5-dibromophenyl)propane, 2,2-bis[4-(4-N-maleimidylphenoxy)phenyl]propane and 2,2-bis(4-N-maleimidyl 2-methyl-5-phenyl)propane, and the acridine compound is selected from the group consisting of 9-methylacridine, 9-ethylacridine, 9-butylacridine, 3,6-diethoxy-9-methylacridine, 1,2-di-9-acridinylethane, 1,3-di-9-acridinylpropane, 1,4-di-9-acridinylbutane, 1,7-di-9-acridinylheptane and 1,8-di-9-acridinyloctane.

10. A film produced by coating a surface of a support with the resin composition of claim 1, and then drying the coating of the resin composition.

11. A film produced by coating a surface of a support with the resin composition of claim 3, and then drying the coating of the resin composition.

12. A laminate comprising a substrate and a patterned layer of a cured product of the resin composition of claim 1, produced by forming a layer of the resin composition, partially photo-curing the layer of the resin composition by irradiation of light, removing a part of the layer of the resin composition, where the resin composition did not undergo photo-cure, by development, and then further thermally curing the layer of the resin composition with heat.

13. A laminate comprising a substrate and a patterned layer of a cured product of the resin composition of claim 3, produced by forming a layer of said resin composition of claim 2 on the substrate, partially photo-curing the layer of the resin composition by irradiation of light, removing a part of the layer of the resin composition, where the resin composition did not undergo the photo-cure, by development, and then further curing the layer of the resin composition with heat.

14. A method of producing a multilayer wiring board, comprising preparing a insulating substrate bearing on a surface thereof a first circuit, forming an insulating layer which comprises the resin composition of claim 3, on the surface of the insulating substrate bearing the first circuit, making a via hole in the insulating layer, and carrying out copper plating to form a second circuit on the insulating layer and to make interlayer-connection through the via hole.

15. The method of claim 14, wherein the via hole is made by partially photo-curing the layer of the resin composition by irradiation of light, removing a part of the layer of the resin composition, where the resin composition did not undergo the photo-cure, by development.

16. The method of claim 15, wherein the (B) resin ingredient is selected from the group consisting of an epoxy resin, a modified epoxy resin, a resin having a phenolic hydroxyl group, a melamine resin, a cyanate-ester resin, a rubber, acrylate monomer, acrylate oligomer, epoxy acrylate and novolac epoxy acrylate.

17. The method of claim 16, wherein the (B) resin ingredient has at least one vinyl-polymerizable unsaturation.

18. The method of claim 16, wherein the (B) resin ingredient is selected from the group consisting of a vinyl-polymerizable carboxylic acid-modified epoxy resin, a carboxylic acid-modified rubber, an acrylate monomer, an acrylate oligomer, an epoxy acrylate and a novolac epoxy acrylate.

19. The method of claim 15, wherein the (A) bismaleimide compound is selected from the group consisting of m-di-N-maleimidylbenzene, bis(4-N-maleimidylphenyl) methane, 2,2-bis(4-N-maleimidylphenyl)propane, 2,2-bis(4-N-maleimidyl-2,5-dibromophenyl)propane, 2,2-bis[4-(4-N-maleimidylphenoxy)phenyl]propane and 2,2-bis(4-N-maleimidyl-2-methyl-5-phenyl)propane, and the acridine compound is selected from the group consisting of 9-methylacridine, 9-ethylacridine, 9-butylacridine, 3,6-diethoxy-9-methylacridine, 1,2-di-9-acridinylethane, 1,3-di-9-acridinylpropane, 1,4-di-9-acridinylbutane, 1,7-di-9-acridinylheptane and 1,8-di-9-acridinyloctane.

20. The resin composition of claim 1, wherein said acridine compound is a thermosetting accelerator for said bismaleimide compound, said acridine compound causing the bismaleimide compound to undergo crosslinking.

21. The resin composition of claim 1, wherein the acridine compound is included in an amount of 0.5 to 25 parts by weight per 100 parts by weight of the bismaleimide compound.

22. The method of claim 15, wherein after said development, a remaining part of the insulating layer, not removed by the development, is cured by heat.

23. The method of claim 15, wherein curing of the remaining part by heat is performed at a temperature of 100° to 200° C.

24. A method of producing a multilayer wiring board, comprising the steps of forming an insulating layer which comprises the resin composition of claim 3 on a surface of a substrate, and curing the resin composition by heating.

25. The method of claim 24, wherein the heating is performed at a temperature in the range of 100°–200° C.

26. The resin composition of claim 25, wherein said acridine compound is a thermosetting accelerator for said bismaleimide compound, said acridine compound causing the bismaleimide compound to undergo crosslinking.

27. The resin composition of claim 25, wherein the amount of the acridine compound in the resin composition is 0.2 to 20 parts by weight per 100 parts by weight of the bismaleimide compound and the resin ingredient.

28. The resin composition of claim 25, wherein the amount of the acridine compound in the resin composition is 0.5 to 10 parts by weight per 100 parts by weight of the bismaleimide compound and the resin ingredient.

29. The resin composition of claim 28, wherein the amount of the bismaleimide compound in the resin composition is 10–60 parts by weight.

30. The resin composition of claim 1, which consists essentially of the bismaleimide compound and the acridine compound.

31. The resin composition of claim 30, which consists of the bismaleimide compound and the acridine compound.

32. The resin composition of claim 25, which consists essentially of the bismaleimide compound, the resin ingredient and the acridine compound.

33. The resin composition of claim 32, which consists of the bismaleimide compound, the resin ingredient and the acridine compound.

34. The resin composition of claim 32, wherein the (C) acridine compound is selected from the group consisting of 9-methylacridine, 9-ethylacridine, 9-butylacridine, 3,6-diethyoxy-9-methylacridine, 1,2-di-9-acridinylpropane, 1,3-di-9-acridinylpropane, 1,4-di-9-acrydinylbutane, 1,7-di-9-acridinylheptane and 1,8-di-9-acridinyloctane.

35. The resin composition of claim 32, wherein the (B) resin ingredient is selected from the group consisting of an epoxy resin, a modified epoxy resin, a resin having a phenolic hydroxyl group, a melamine resin, a cyanate-ester resin, a rubber, acrylate monomer, acrylate oligomer, epoxy acrylate and novolac epoxy acrylate, and the (C) acridine compound is selected from the group consisting of 9-methylacridine, 9-ethylacridine, 9-butylacridine, 3,6-diethyoxy-9-methylacridine, 1,2-di-9-acridinylethane, 1,3-di-9-acridinylpropane, 1,4-di-9-acridinylbutane, 1,7-di-9-acridinylheptane and 1,8-di-9-acridinyloctane.

* * * * *